United States Patent
Ouyang

(10) Patent No.: US 7,886,816 B2
(45) Date of Patent: *Feb. 15, 2011

(54) INTELLIGENT COOLING METHOD COMBINING PASSIVE AND ACTIVE COOLING COMPONENTS

(75) Inventor: Chien Ouyang, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 1223 days.

This patent is subject to a terminal disclaimer.

(21) Appl. No.: 11/502,696

(22) Filed: Aug. 11, 2006

(65) Prior Publication Data

US 2008/0036076 A1  Feb. 14, 2008

(51) Int. Cl.
  *H05K 7/20* (2006.01)
  *F28F 27/00* (2006.01)
  *F28D 15/00* (2006.01)
(52) U.S. Cl. ............... 165/299; 165/300; 165/80.3; 165/80.4; 165/80.5; 165/104.33; 361/689; 361/698; 361/699; 361/701; 361/702; 361/703
(58) Field of Classification Search ............ 165/80.3, 165/80.4, 80.5, 104.33, 299, 300; 361/701, 361/699, 703, 718, 689, 698, 702
See application file for complete search history.

(56) References Cited

U.S. PATENT DOCUMENTS

| 5,896,917 | A  | * | 4/1999 | Lemont et al. | ............. 165/80.3 |
| 6,357,515 | B1 | * | 3/2002 | Bhatia | ............. 165/80.3 |
| 6,766,817 | B2 |   | 7/2004 | da Silva et al. | |
| 6,880,345 | B1 | * | 4/2005 | Leija et al. | ............. 62/259.2 |
| 6,918,404 | B2 |   | 7/2005 | Dias da Silva et al. | |
| 7,066,586 | B2 |   | 6/2006 | da Silva et al. | |
| 7,104,313 | B2 | * | 9/2006 | Pokharna et al. | ............. 165/80.4 |
| 7,245,495 | B2 | * | 7/2007 | Ouyang | ............. 361/701 |

FOREIGN PATENT DOCUMENTS

JP    10132478 A  *  5/1998

* cited by examiner

*Primary Examiner*—John K Ford
(74) *Attorney, Agent, or Firm*—Osha Liang LLP

(57) ABSTRACT

A method for cooling a semiconductor including passive cooling including transferring heat via passive cooling components; active cooling including transferring heat via active cooling components; and controlling the active cooling based on temperature of the semiconductor. A cooling system for a semiconductor including: a passive component in thermal contact with the semiconductor; an active cooling component in thermal contact with the semiconductor; and a controller controlling the active cooling component.

8 Claims, 9 Drawing Sheets

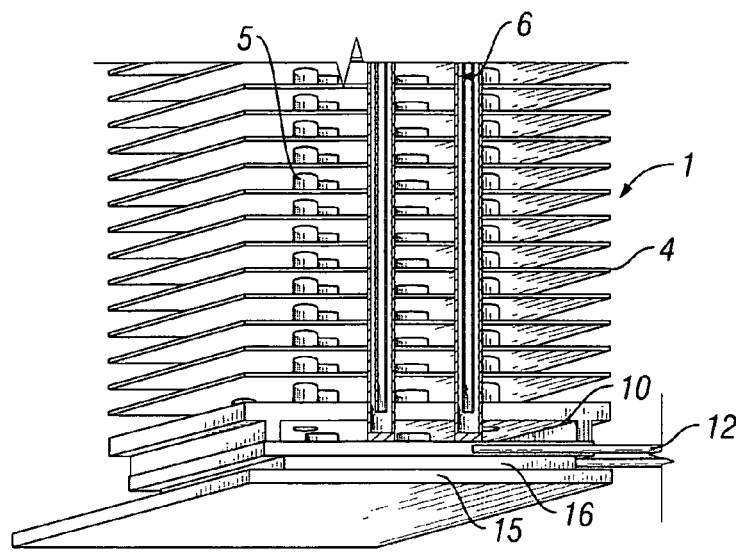
FIG. 9
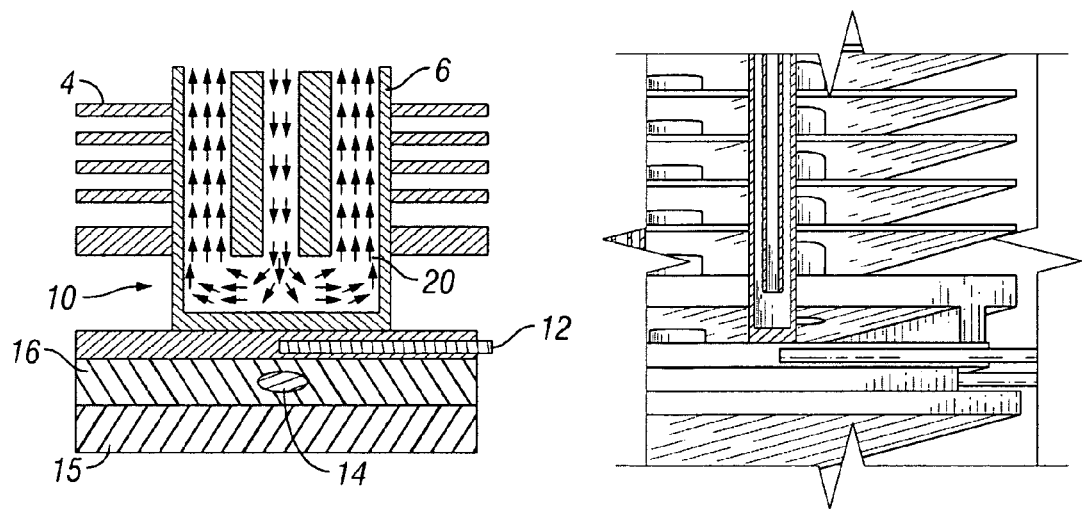
FIG. 10A  FIG. 10B

- ⊚ MHD FLUID FLOWING OUT OF PAPER
- ⊕ MHD FLUID FLOWING INTO PAPER
- ← ELECTRICAL CURRENT DIRECTION
- ⇐ MAGNETIC FIELD DIRECTION

- ⊚ MHD FLUID FLOWING OUT OF PAPER
- ⊕ MHD FLUID FLOWING INTO PAPER
- ← ELECTRICAL CURRENT DIRECTION
- ⇐ MAGNETIC FIELD DIRECTION

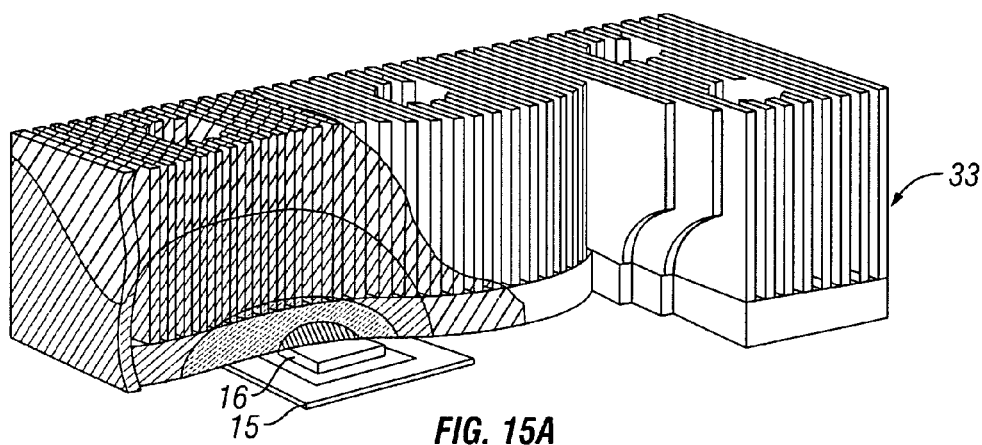
FIG. 15A
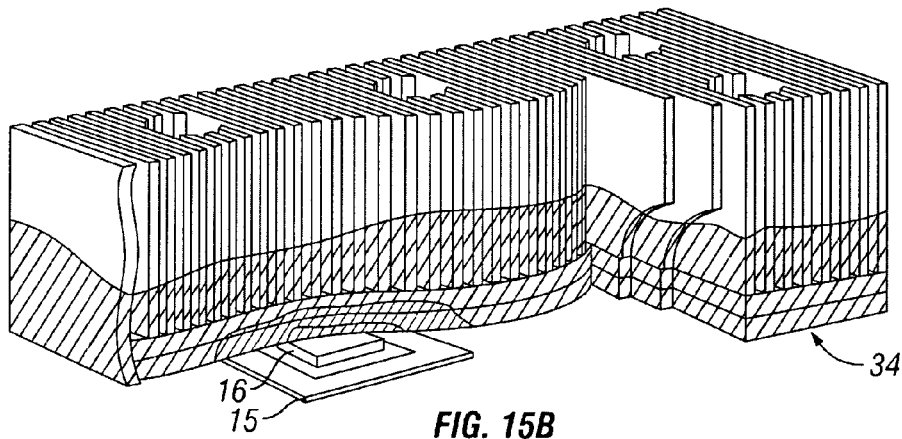
FIG. 15B
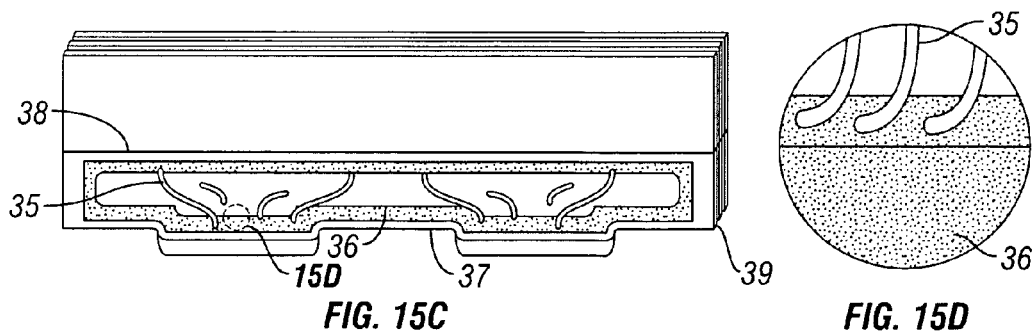
FIG. 15C  FIG. 15D

INTELLIGENT COOLING METHOD COMBINING PASSIVE AND ACTIVE COOLING COMPONENTS

BACKGROUND OF INVENTION

All semiconductor devices have some form of conduction resistance which leads to generation of heat when these devices are operated. The flow of heat starts at the semiconductor junction through which electric current travels. This heat is conducted from the device body onto the package that the semiconductor is housed in, and then to the air. This heat energy increases the temperature of the semiconductor. If the heat is not dissipated from the semiconductor fast enough, the semiconductor temperature may increase beyond the specified operating temperature. A heat sink is an environment or object that absorbs heat from another object using thermal contact. Heat sinks are used to aid in the absorption of heat from the surface of a semiconductor.

FIG. 1 shows an example of a heat sink. The heat producing semiconductor 16 is attached to a substrate 15. A metal lid 19 is placed in close proximity to the semiconductor 16. The metal lid 19 and the semiconductor are brought in thermal contact with the help of thermal interface material 18. The metal heat sink 17 is placed on top of the lid 19, and both the lid 19 and heat sink 17 are brought into thermal contact using thermal interface material 18. The goal of a heat sink is to effectively transfer heat away from the surface of the semiconductor to the surrounding air. The heat transfer can occur in three ways: conduction, convection and radiation. In the example shown in FIG. 1, heat flows from the surface of the semiconductor 16 to the lid 19 through conduction. The transfer of heat from the lid 19 to the heat sink 17 is also through conduction. The heat transfer from the surface of the heat sink 17 to the surroundings is through convection and radiation. Increase in the rate of the above three modes of transfer of heat increases the rate at which heat is transferred away from the semiconductor.

Heat transfer through conduction can be increased by using materials with high conduction coefficient. Metals are good conductors of heat; especially metals like copper, silver and gold. Convection transfers heat energy by currents within the fluid. If the surrounding fluid of the heat sink 17 (shown in FIG. 1) is air, then the heat is transferred due to currents near the air and heat sink interface. If the currents are caused only due to the temperature gradient near the interface of air and the heat sink, then the heat transfer is due to natural convection. If the currents in the fluid are also caused by external forces, then this mode of heat transfer is called forced convection. For example, a fan can be placed above the heat sink 17 to force the air around it and increase the rate of heat transfer.

Passive cooling, for example, use heat pipes that employ phase changing mechanism to transfer heat from the semiconductor to the heat sink fins. A liquid undergoes phase change into vapor by absorbing heat at the evaporator end placed over the semiconductor. The vapor then releases heat at the condenser end, which is in contact with the heat sink fins, by changing its phase back to liquid. Electrical energy is not employed to carry out the passive cooling mechanism. The mechanism occurs naturally when there is a temperature difference between the evaporator and the condenser sites. Active cooling methods, on the other hand, require forcing a fluid, for example magneto-hydro-dynamic (MHD) fluid, over a hot surface in order to cool it. The fluid is usually forced by means of a pump. The pump uses external energy, for example electrical energy, for its operation. The moving fluid absorbs heat from the semiconductor and dissipates the heat to its surroundings. The fluid may also be made to make thermal contact with a heat sink to enhance heat dissipation.

FIG. 2 shows two cooling devices, the passive heat pipe cooling (A) and active liquid cooling (B). Both cooling methods have their own advantages and disadvantages. With regard to passive cooling, the method does not consume external energy for its operation. Although heat pipe passive cooling method is currently quite effective in cooling high power semiconductors, the increasing power dissipation of future semiconductors may render this passive cooling method inadequate due to physical limitations of size and rate of heat transfer.

Due to their high heat transfer rates, active cooling methods are generally very efficient in cooling high power dissipating semiconductors. However, active cooling methods consume external power for their operation. Thus, in instances when the power supply to the active cooling components is interrupted or fails, the semiconductor may reach undesirable temperatures.

SUMMARY OF INVENTION

In one aspect, embodiments disclosed herein relate to a method for cooling a semiconductor comprising: active cooling comprising transferring heat via active cooling components; passive cooling comprising transferring heat via passive cooling components; and controlling the active cooling based on temperature of the semiconductor.

In one aspect, embodiments disclosed herein relate to a cooling system for a semiconductor including an active cooling component in thermal contact with the semiconductor a passive cooling component in thermal contact with the semiconductor; and a controller controlling the active cooling component.

BRIEF DESCRIPTION OF DRAWINGS

FIG. 9 shows another perspective of the embodiment illustrated in FIG. 8.

FIGS. 10A-10B depict the flow of the MHD fluid inside the MHD pipe near a hot spot of the semiconductor in accordance with an embodiment of the present invention.

FIG. 15 shows a cavity-based heat sink in accordance with an embodiment of the present invention.

DETAILED DESCRIPTION

In one aspect, some embodiments disclosed herein relate to methods and systems for effectively transferring heat away from a desired location. In particular, embodiments of the present invention relate to methods and systems utilizing a passive cooling means to transfer heat, an active cooling means to transfer heat and a means to control the rate of active cooling. The passive cooling means may involve using heat pipes. The active cooling means may involve using magneto-hydro-dynamic (MHD) fluid. The invention further involves controlling the rate of active cooling means through a controller, for e.g., a multiple-input-multiple-output (MIMO) controller.

Embodiments of the present invention are described in detail below with respect to the drawings. Like reference numbers are used to denote like parts throughout the figures.

Figure 1:
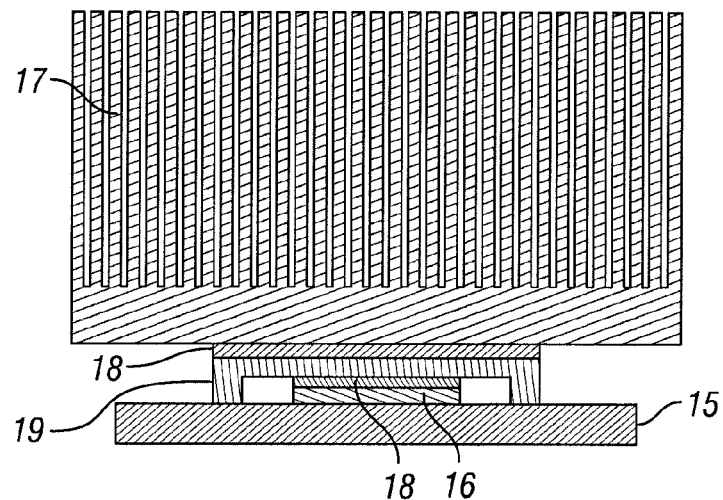
FIG. 1 illustrates the basic principle of a heat sink.
Figure 2A:
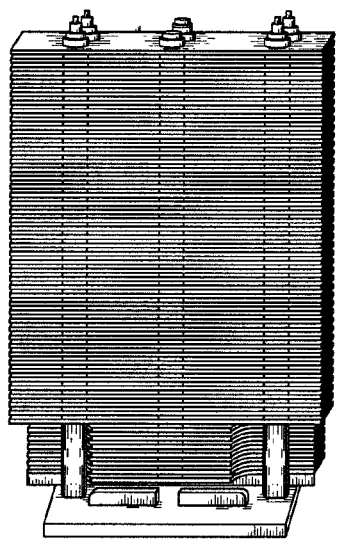
FIGS. 2A-2B show passive and active cooling respectively.
Figure 2B:
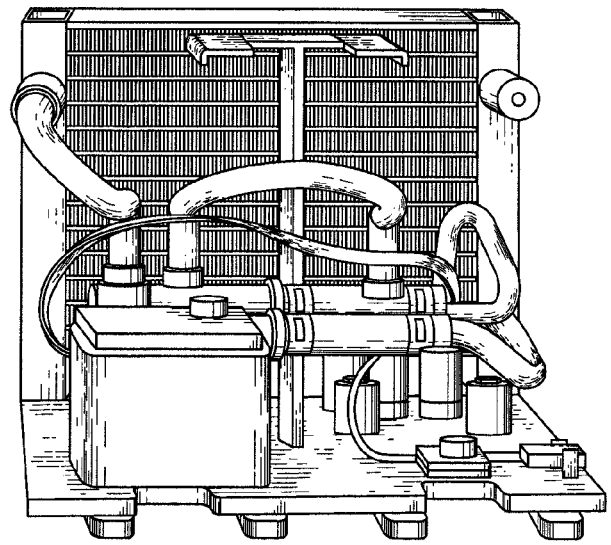
Figure 3:
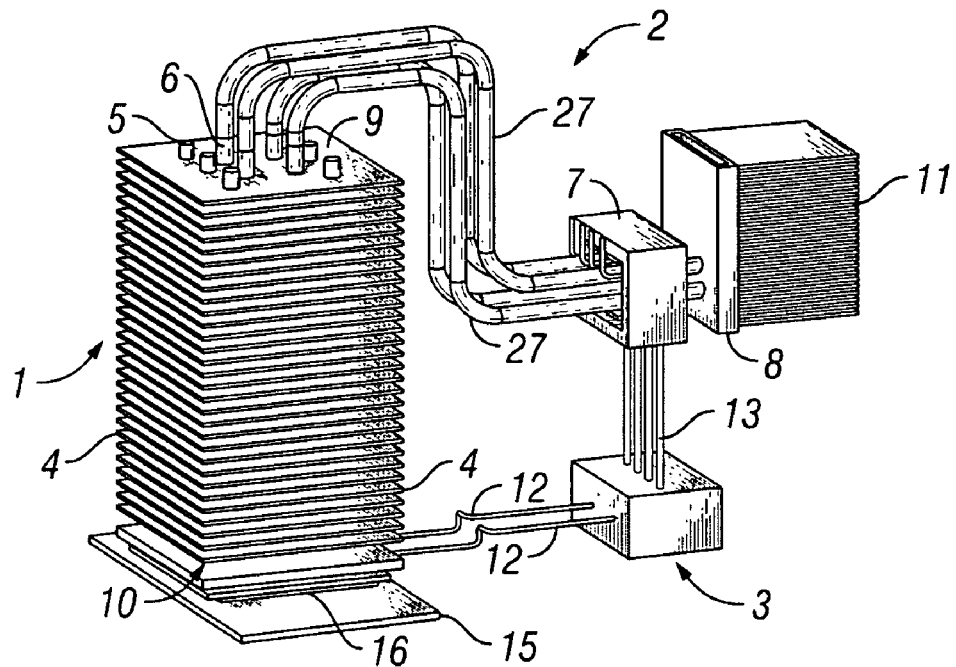
FIG. 3 shows a cooling method combining passive and active cooling components in accordance with an embodiment of the present invention.

FIG. 3 illustrates a cooling system in accordance with the embodiments of the present invention. The passive cooling component 1 is combined with active cooling component 2 in addition to the controller 3. The semiconductor 16 requiring cooling is shown to be fastened to a substrate 15, which may be a printed circuit board. The heat sink base cavity 10 makes thermal contact with the surface of the semiconductor 16. The heat sink base cavity 10 enhances the heat transfer in an in-plane direction. The passive cooling component 1 may include a heat sink comprising of a plurality of heat sink fins 4, and a plurality of heat pipes 5 embedded within the heat sink. The heat sink fins 4 are arranged on top of the heat sink base cavity 10. The heat pipes 5 are in thermal contact with the heat sink fins 4. FIG. 3 shows one embodiment wherein the heat pipes 5 pass substantially normal through the plurality of heat sink fins 4. The heat pipes 5 may extend from the top of the topmost heat sink fin 9 to the inside of the heat sink base cavity 10. The heat pipes 5 transfer heat from the heat sink base cavity 10 to the heat sink fins 4.

The active component 2 of one embodiment of the present invention comprises of a plurality of MHD pipes 6 embedded within the heat sink fins 4. The MHD pipes 6 may pass through the heat sink fins 4 in a direction substantially normal to the plane of the heat sink fins 4. The MHD pipes 6 are in thermal contact with the heat sink fins 4, and extend from the top of the topmost heat sink fin 9 to the bottom of the heat sink base cavity 10. The MHD pipes 6 may be made out of a material with high coefficient of thermal conductivity, for e.g., copper. The MHD pipes are connected to the MHD pump 7 through another set of pipes 27 made up of electrically non-conductive material, for e.g. plastic. The pipes 27 extend to a reservoir 8 which contains MHD fluid. An auxiliary heat sink 11 may be attached to the reservoir 8 to improve heat transfer.

The controller 3 is a multiple-input-multiple-output (MIMO) controller. A plurality of temperature sensors, for e.g. thermal couples, 12 sense the temperature of the hot spots on the semiconductor 16 and provide this information to the controller 3. The controller provides control signals as well as power to the MHD pump 7 through wires 13. The wires may be made out of an electrically conductive material, for e.g., copper. The wires may or may not be insulated. The controller 3 regulates the flow of the MHD fluid, depending upon the output of the thermal couples 12, to maintain the temperature of the hot spots (not shown) of the semiconductor 16 within allowable limits.

Figure 4:
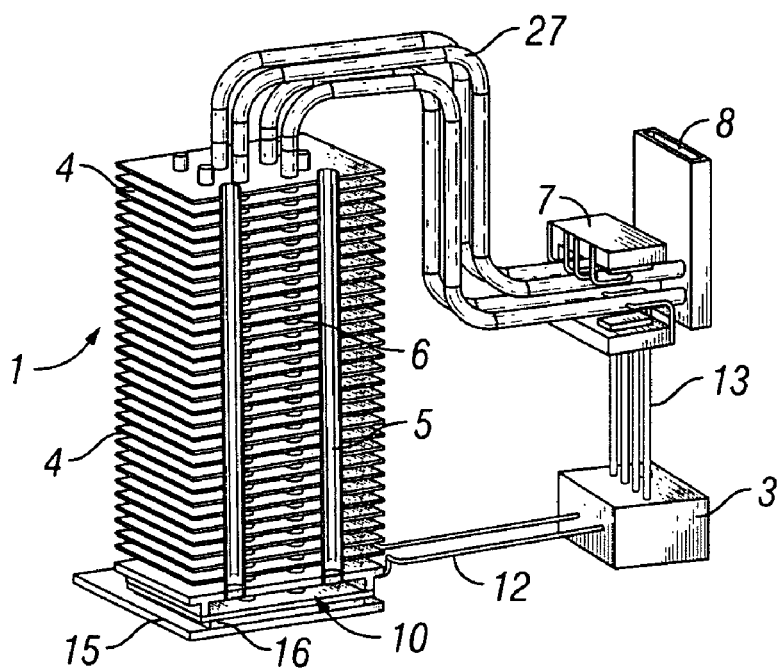
FIG. 4 shows the cross-section of the heat pipes in accordance with an embodiment of the present invention.
Figure 5A:
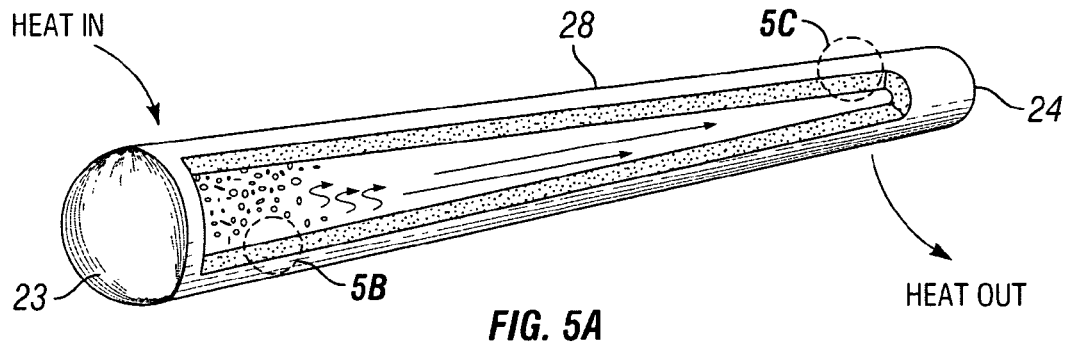
FIGS. 5A-5C illustrate the working of a heat pipe in accordance with an embodiment of the present invention.
Figure 5B:
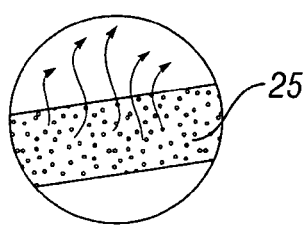
Figure 5C:
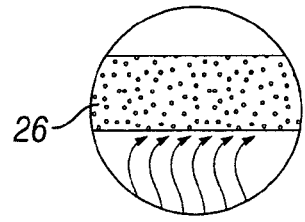

FIG. 4 shows a cross-section of one embodiment of the present invention. The heat pipes 5 extend from within the heat sink base cavity 10 to the top of the topmost heat sink fin 9. The function of the heat sink pipes is to transfer heat from one end of its length to the other through phase changing mechanism. FIGS. 5A-5C show an embodiment of a heat pipe 5. The heat pipe 5 comprises of a vacuum tight envelope 28, a wick 26 and a working fluid 25. The heat pipe 5 is evacuated and then back-filled with a small quantity of working fluid 25, just enough to saturate the wick 26. The atmosphere inside the heat pipe 5 is set by equilibrium of liquid and vapor. One end of the heat pipe 5 is called the evaporator 23 and the other end is called the condenser 24. As heat enters the evaporator 23, the liquid-vapor equilibrium is disturbed, generating vapor at a slightly high pressure. This high pressure vapor travels to the condenser 24 end where the slightly lower temperature causes the vapor to condense. The condensed fluid 25 is forced back to the evaporator by capillary forces developed in the wick 26.

This continuous cycle transfers large quantities of heat with very low thermal gradients. The operation of a heat pipe is passive, since it is driven only by the heat that is transferred. The passive operation results in high reliability and long life.

Figure 6:
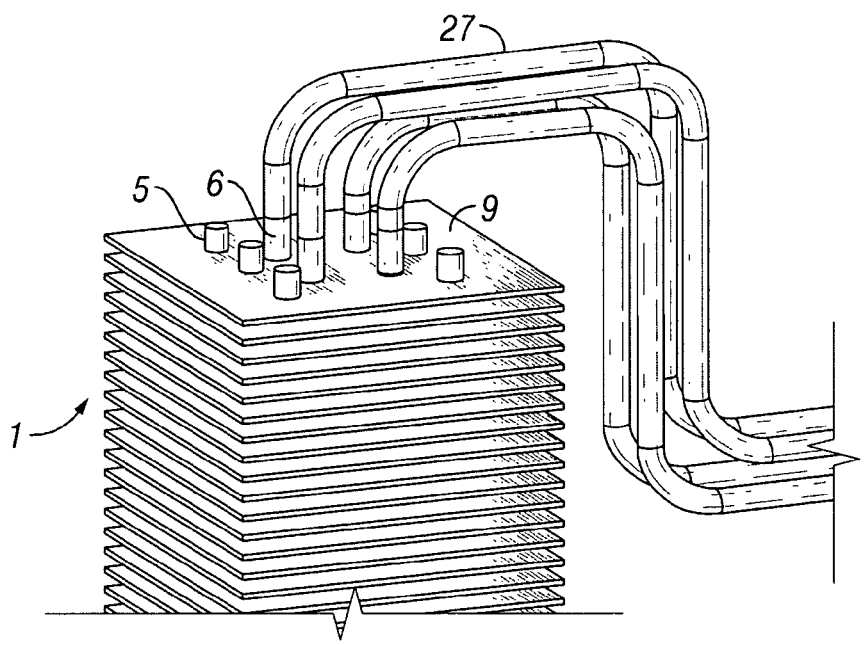
FIG. 6 shows a plurality of heat pipes and MHD pipes emerging from the top of the heat sink in accordance with an embodiment of the present invention.

In accordance with one or more embodiments of the present invention, FIG. 6 shows that the heat pipe 5 may extend to the top of the topmost heat sink fin 9. The MHD pipes 6, embedded within the heat sink 1, are connected to plastic MHD pipes 27.

Figure 7:
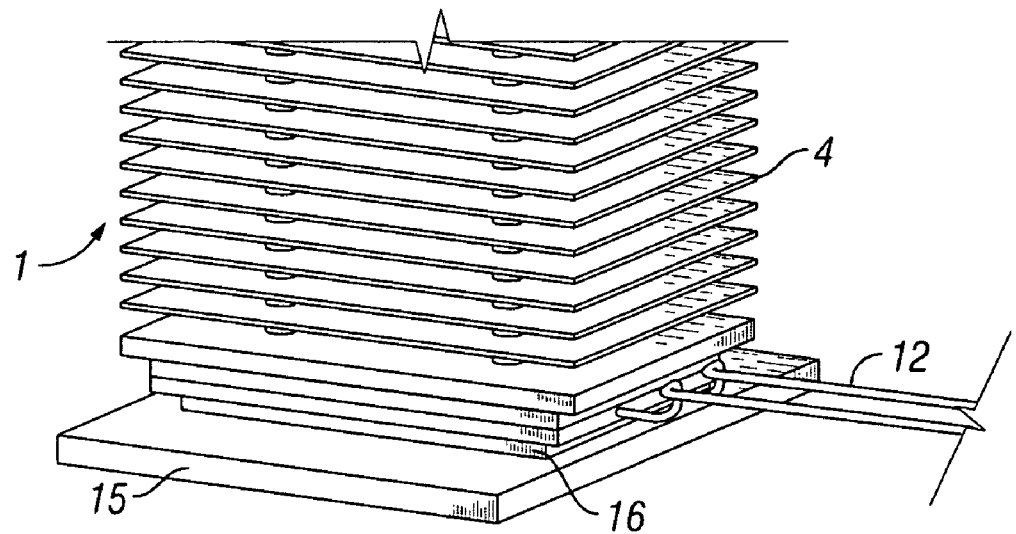
FIG. 7 shows the bottom of the heat sink in thermal contact with the semiconductor that is fastened to a substrate in accordance with an embodiment of the present invention.

The semiconductor 16, as shown by way of example in FIG. 7, is in thermal contact with the heat sink base cavity 10. The thermal couples 12 may be embedded in the base cavity 10. The thermal couples sense the instantaneous temperature of the semiconductor 16.

Figure 8:
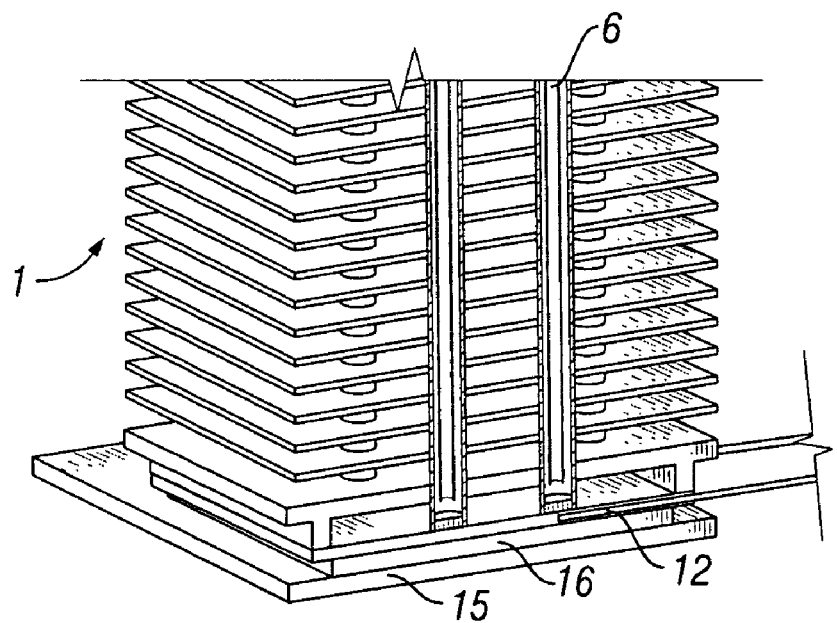
FIG. 8 illustrates the concentric pipe composition of MHD pipes in addition to the location of the thermal couple in accordance with an embodiment of the present invention.
Figure 11A:
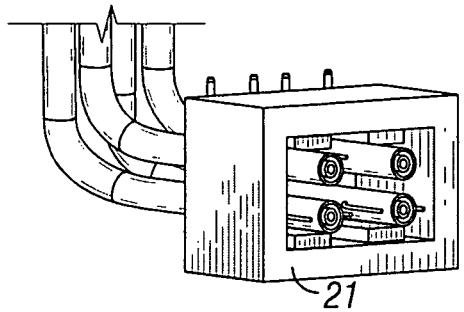
FIGS. 11A-11D show the components of the MHD pump in accordance with an embodiment of the present invention.
Figure 11B:
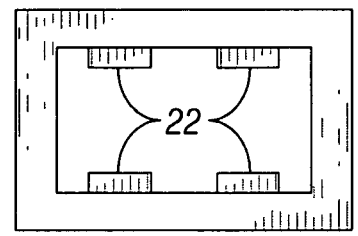
Figure 11C:
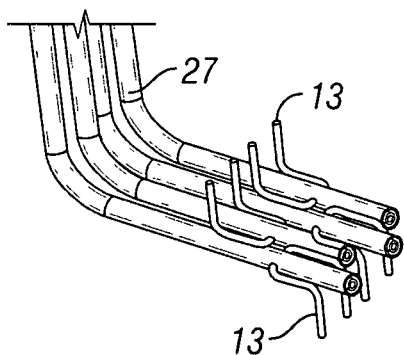
Figure 11D:
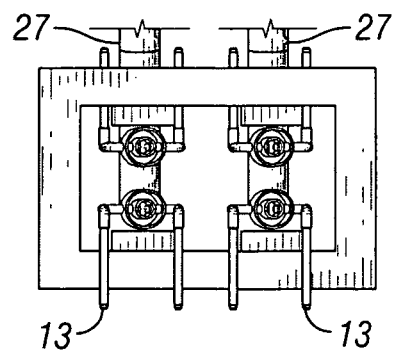

FIG. 8 and FIG. 9 show the cross-section of MHD pipes 6. The MHD pipes 6 have two concentric pipes that carry the MHD fluid. The thermal couple 12 embedded in the base cavity is placed near the bottom of the MHD pipe 6. In accordance with one or more embodiments of the present invention, one end of the MHD pipes 6 and the tip of the thermal couple 12 may be placed near a hot spot 14 of the semiconductor as shown in FIG. 10A. The cooler MHD fluid flows to the end of the MHD pipe through one of the concentric pipes and absorbs the heat generated by the semiconductor. The hot MHD fluid 20 is carried away through the other concentric pipe. The rate of heat absorption depends upon the rate of flow of the MHD fluid 20. An increase in the MHD fluid 20 flow rate will increase the amount of heat transferred away from the hot spot 14.

Figure 12A:
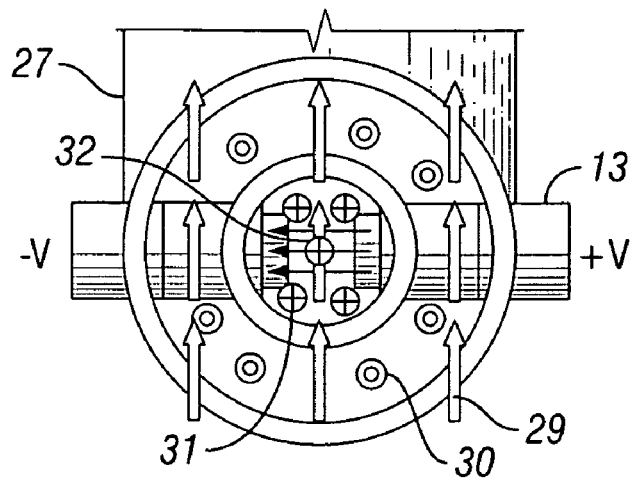
FIGS. 12A-12B illustrate the working of the MHD pump as shown in the embodiments of FIG. 11A-11D.
Figure 12B:
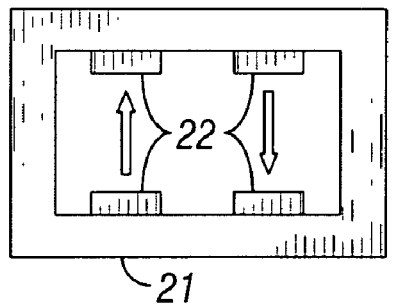

The rate of flow of the MHD fluid 20 is controlled by the MHD pump. FIGS. 11A-11D show an embodiment of the MHD pump 7. The MHD pump comprises of a ferromagnetic yolk 21 in which magnets 22 and the MHD plastic pipes 27 are mounted. Two copper wires 13 are inserted inside the MHD pipes 27 from opposite directions in such a way that the wires make electric contact with the MHD fluid 20 inside the inner concentric pipe only. The wires are also placed in a direction orthogonal to the magnetic field 29 formed by the magnets 22. FIG. 12A depicts the flow of the MHD fluid 20 in the presence of a magnetic field and electric field. The direction of the magnetic field is shown by arrows 29. The direction of the electric current, shown by arrows 32 flow in a direction orthogonal to the magnetic field. The charged particles in the fluid 20 inside the pipe 27 are driven by the electric field in the electrical current direction 32 and are subsequently subject to magnetic propulsion in the direction shown by symbol 31 which is normal to and inside the plane of the paper. This flow of the MHD fluid in the inner pipe, in the direction shown by symbol 31, results in a flow of the MHD fluid in the outer pipe in the opposite direction, as shown by the symbol 30. The strength of the magnetic propulsion, F, is proportional to the strength of the magnetic field B and the velocity v of the charged particles in the direction of the electrical current shown in FIG. 12A. Consequently, F, is expressed as $$F = v \times B,$$

may be effectively controlled with an amplitude of the electrical current through the copper wires 13.

Figure 13A:
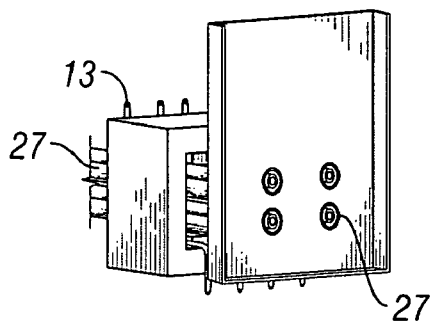
FIGS. 13A-13C show the MHD fluid reservoir in accordance with an embodiment of the present invention.
Figure 13B:
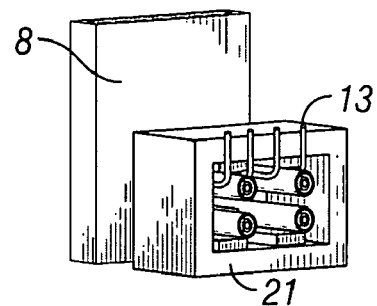
Figure 13C:
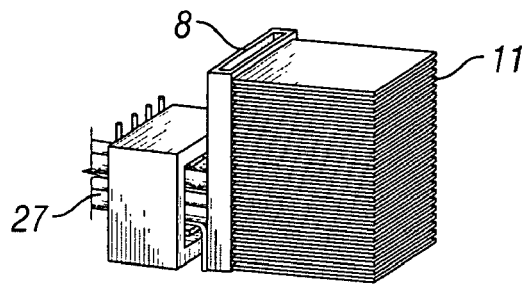

The MHD pipes are attached to a reservoir 8, as shown in embodiments of FIG. 13A-13B. The reservoir 8 contains MHD fluid 20. In accordance with some embodiments of the present invention, a plurality of heat sink fins 11 may be attached to the MHD fluid reservoir 8 as shown in FIG. 13C. When the temperature of the hot spot 14 is extremely high, the heat sink fins 11 attached to the reservoir can enhance cooling.

Figure 14:
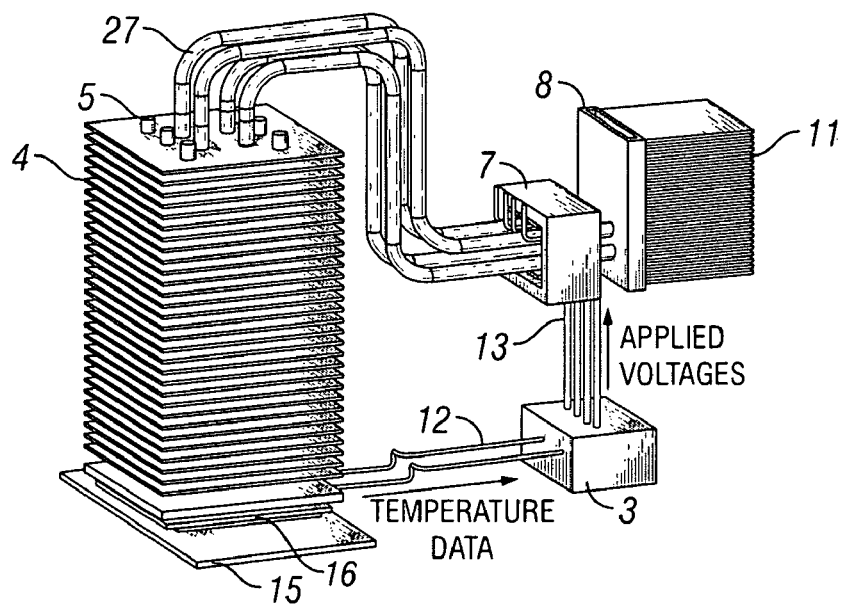
FIG. 14 shows the MIMO controller in accordance with an embodiment of the present invention.

An embodiment of the present invention is shown in FIG. 14. The thermal couple 12, the controller 3 and the MHD pump 7 from a closed loop feedback control system. One or more embodiments of the present invention have discrete time multiple-input-multiple-output (MIMO) controller. The MIMO controller 3 receives data on the temperature of a plurality of hot spots 14 through the thermal couples 12. The MIMO controller dynamically adjusts the voltage applied to appropriate pipes in the MHD pump 7, which, in turn, alters the rate of flow of the MHD fluid 20 through the pipes 27 and 6. The MIMO controller may be capable of optimally counteracting the local spatial temperature on the semiconductor 16 arising from spatial variations in thermal flux. In addition, the MIMO may optimally control the temperature variations arising from dynamic user load activity.

In accordance with one or more embodiments of the present invention, the controller 3 may adjust the voltage applied to the MHD pump 7, through wires 13, to turn off the flow if MHD fluid 20 through the MHD pipes 27 and 6. In other words, the passive cooling component 1 may be used as a default cooling method, and the active cooling component 2 turned on only when the MIMO controller determines that the cooling capabilities of the passive cooling components have reached their limit. As can be seen FIG. 10A and FIG. 14, the controller 3 senses the temperature of the hot spots 14 by way of thermal couples 12. If the temperature exceeds a predetermined threshold T1, the controller may adjust the voltage on the appropriate wires 13 attached to the MHD pump 7 to increase the flow of MHD fluid 20 in the MHD pipe 6 near the sensed hot spot 14. When the temperature of the hot spot goes below a threshold T2, the controller 3 may adjust the voltage to stop the flow of MHD fluid 20 through the MHD pipes 27 and 6. Thus, the turning off of the active cooling component 2 when not needed can save energy.

In accordance with one or more embodiments of the present invention, the MHD fluid 20, when turned off by the controller 3, may still aid in cooling the hot spots 14 by transferring heat from the hot spot 14 to the heat sink fins 4. In other words, even when the MHD fluid 20 flow is turned off, the temperature gradient formed within the MHD pipes 6 may set up local MHD fluid flow currents carrying heat energy from the hot spot 14 to heat sink fins 4. Thus, the MHD fluid in the MHD pipes 6 can enhance passive cooling. A unique property of one or more embodiments of the present invention is highlighted when, for some applications, the hot spots 14 on the semiconductor 16 may require an extremely large heat sink to cool them down; the MHD pipes 6 on over the hot spots 14 greatly enhance cooling efficiency.

A system in accordance with one or more embodiments of the present invention includes a cavity-based heat sink 34, as shown in an exemplary configuration in FIG. 15. On the base 37 of the cavity-based heat sink 34 is a vapor chamber 39. The vapor chamber 39 is evacuated to create a vacuum and has a saturated wick structure lining 36 on the inside walls. The base 37 of the cavity-based heat sink 34 is placed in thermal contact with the semiconductor 16. As heat is applied to the base 37, the working fluid 35 at that location immediately vaporizes which in turn fills the vacuum. Whenever the vapor 35 comes in contact with a cooler wall surface 38, it condenses, releasing its latent heat of vaporization. The condensed fluid 35 returns to heat source via capillary action in the wick structure. This capillary action enables the cavity-based heat sink to work in any orientation with respect to gravity. As in a heat pipe, the thermal resistance associated with the vapor spreading is negligible, providing an effective means of spreading the heat from a concentrated source to a large surface.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A cooling system for a semiconductor comprising:
a passive cooling component in thermal contact with the semiconductor;
wherein the passive cooling component comprises a plurality of heat sink fins on top of a heat sink base cavity;
an active cooling component in thermal contact with the semiconductor;
wherein the active cooling component further comprises a plurality of magneto-hydro-dynamic (MHD) pipes, carrying an MHD fluid;
a controller controlling the active cooling component; and
the MHD pipes being substantially normal to and passing through the heat sink fins.

2. The system of claim 1 further comprises an MHD pump connected to the MHD pipes.

3. The system of claim 1 further comprises a reservoir for the MHD fluid.

4. The system of claim 3 further comprises an auxiliary heat sink in thermal contact with the reservoir.

5. The system of claim 1, the controller further comprises:
a plurality of temperature sensors extending from a bottom of a heat sink base cavity to a controller input port;
a plurality of wires extending from an output port of the controller to a magneto-hydro-dynamic (MHD) pump.

6. The system of claim 5, wherein one end of at least one of the plurality of temperature sensors is placed near a hot spot of the semiconductor.

7. A cooling system for a semiconductor comprising:
a passive cooling component in thermal contact with the semiconductor;
wherein the passive cooling component comprises a plurality of heat sink fins on top of a heat sink base cavity;
an active cooling component in thermal contact with the semiconductor;
wherein the active cooling component further comprises a plurality of magneto-hydro-dynamic (MHD) pipes, carrying an MHD fluid;
a controller controlling the active cooling component; and
the MHD pipes extending from a topmost plate of the heat sink fins to a bottom of the heat sink base cavity.

8. The system of claim 7 further comprises the MHD pipes being positioned over a hot spot of the semiconductor.

* * * * *